United States Patent [19]

Fiock

[11] Patent Number: 4,876,459

[45] Date of Patent: Oct. 24, 1989

[54] TOGGLING SPEAKERSWITCH

[76] Inventor: Thomas P. Fiock, Box 236, Rte. 2, Murphysboro, Ill. 62966

[21] Appl. No.: 270,769

[22] Filed: Nov. 14, 1988

[51] Int. Cl.⁴ .............................................. H02J 1/00
[52] U.S. Cl. ....................................... 307/11; 307/38; 307/125; 381/18; 381/28
[58] Field of Search ............... 307/112, 125, 126, 128, 307/129, 34, 35, 36, 37, 38, 39, 40, 41, 11; 340/825.25, 825.24, 825.37, 584 E, 323 R, 321; 330/123, 51, 124 R; 381/12, 18, 24, 28, 29, 56, 59, 61, 81, 85, 89, 103, 109; 333/167, 18, 28 R; 455/134, 139

[56] References Cited

U.S. PATENT DOCUMENTS

| | | | |
|---|---|---|---|
| 3,916,104 | 10/1975 | Anazawa et al. | 381/26 |
| 4,162,457 | 7/1979 | Grodinsky | 381/28 |
| 4,323,787 | 4/1982 | Sato et al. | 307/38 |
| 4,380,809 | 4/1983 | Sato | 307/38 |
| 4,404,429 | 9/1983 | Griffis | 381/109 |
| 4,437,018 | 3/1984 | Manley | 307/38 |
| 4,464,781 | 8/1984 | Kaneko et al. | 333/28 R X |
| 4,503,554 | 3/1985 | Davis | 381/28 |
| 4,565,991 | 1/1986 | Lupoli | 340/52 R |
| 4,592,046 | 5/1986 | Kawata | 370/58 |
| 4,594,730 | 6/1986 | Rosen | 381/18 X |
| 4,596,963 | 6/1986 | Lawton | 331/14 |

OTHER PUBLICATIONS

"Hifi Auto Switch", by John Clarke, Electronics, Australia (Mar. 1980) vol. 41, pp. 44-49.

Primary Examiner—William M. Shoop, Jr.
Assistant Examiner—Pau Ip
Attorney, Agent, or Firm—Don W. Weber

[57] ABSTRACT

An electronic switching system is presented for use by consumers. Inputs are connected to the circuit which detect which input is producing a signal. The circuit then allows that signal to pass through to be reproduced on output speakers. If both of two inputs are "on," producing two signals, the system toggles between the signals thus reproducing a toggling signal at the speakers. The system may also be adapted to accommodate three or more input signals which would then produce either one output if only one is "on" or a toggling output between those inputs that are "on."

8 Claims, 4 Drawing Sheets

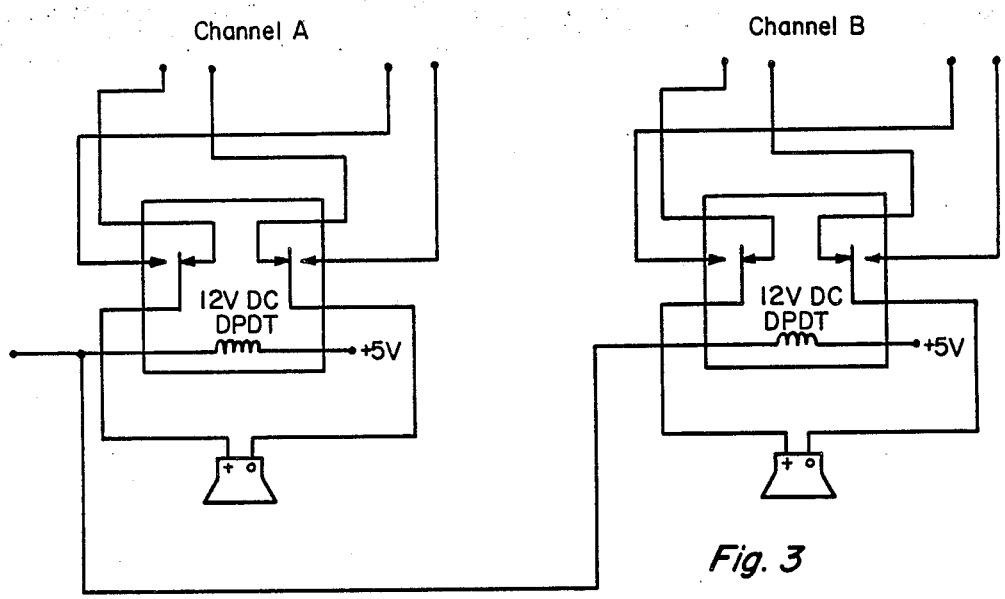
Fig. 3
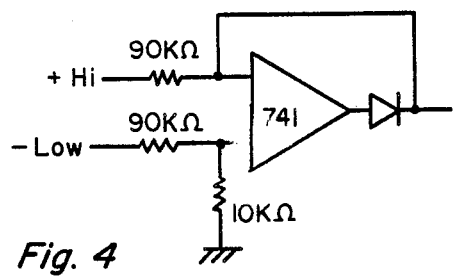
Fig. 4
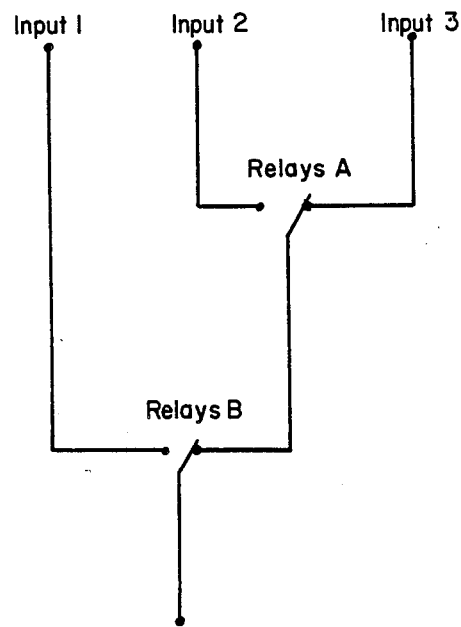
Fig. 7
| Clock | K | J | Q |
|---|---|---|---|
| ⎍ | 1 | 0 | 1 |
| ⎍ | 0 | 1 | 0 |
| ⎍ | 1 | 1 | Toggle |
| ⎍ | 0 | 0 | No Charge |
Fig. 5

TOGGLING SPEAKERSWITCH

BACKGROUND OF THE INVENTION

This invention relates to the field of audio speaker switching and circuitry designed therefore. With the advent of electronic consumer items and new and improved speakers a need has arisen for the design of circuitry which makes the use of these speakers more economical and convenient. Heretofore, it has been necessary to purchase a separate set of speakers for each electronic device or amplifier used by the consumer. If a consumer has an expensive set of speakers for his stereo or cassette deck it would be convenient to use these same speakers for the output of a television or other electronic device. However, switching the speakers manually is inconvenient. A simple device, such as the one presented herein, enables the user to utilize one set of speakers for two or more electronic devices such as a television and a radio.

The use of a switching device in this manner is not unknown to the art. However, the particular use of this invention which involves automatic switching and a toggling affect has not heretofore been advanced.

In Pat. No. 4,565,991, issued to Lupoli in 1986, circuitry was designed to enable a chime system in an automobile to use the existing speakers in the automobile. However, that system merely allowed the chime circuitry to override the normal operation of the car stereo-speaker system. The chime circuit related in Lupoli does not involve the sophisticated electronic circuitry herein.

It is an object of this invention to build a device which will allow two electronic outputs, for example a TV monitor and a stereo system to use the same set of speakers without requiring the user to manually switch from one source to the other.

It is another object of this invention to toggle between two input sources should they be simultaneously operated. This toggling effect would warn the user that one of the inputs should be turned off so that the speakers receive only one input.

It is a further object of this invention to provide a toggling audio effect with approximately one second intervals so that the speakers would receive the signal from alternating input sources should more than one of these sources be operated at the same time.

Another object of this invention is to design circuitry such that any number of devices may be accommodated while the toggling effect remains in the system.

BRIEF SUMMARY OF THE INVENTION

An object of this invention is to allow one set of speakers to be used by multiple input sources without requiring the user to manually switch from one source to the other. If one of the sources is switched on, the system will route the signal from that source to the speakers. If an alternative source is switched "on" with the first source switched "off," the alternative source will be routed to the speakers. If both sources are turned "on" simultaneously, the system will toggle between the sources to indicate to the user that condition. The preferred embodiment of this invention describes circuitry which provides for two input sources such as a television and a stereo system. However, the logic of the circuitry is designed so that the operation of the device could be expanded to three or more inputs. In the case of three inputs, the system will route the input which is switched "on" to the speakers. If any two of the three inputs are switched "on," the system will toggle between the two inputs which are "on." If all three inputs are switched "on," the system will toggle between each of the three inputs.

BRIEF DESCRIPTION OF THE INVENTION

The system, in the preferred embodiment, has been designed for two inputs. It consists of two sensing circuits. The output of each sensing circuit is high if a signal is present and low if no signal is present.

Each sensing circuit has a peak detector circuit. The sensing circuits are then connected to a J-K flip-flop. A timing circuit is also connected to the flip-flop.

The output Q of the flip-flop is connected to a relay driver which amplifies the value of Q. The relay driver is then connected to a transistor switch which is connected to the speaker relays. The purpose of the relay driver and switch is to power two double-pole double-throw relays which actually switch the signals so that the appropriate input is reproduced on the speakers.

Other circuitry is also designed so that more than two inputs may be accommodated with this system. Additionally, should more than one input source be turned on simultaneously, the timer clock will toggle the signals received in the flip-flop. This toggling effect will result in the speakers reproducing the signal alternatively from each source at approximately one second intervals. When in this toggling mode, the operation of the device alerts the user that two sources are simultaneously in the "on" position. Appropriate action may then be taken by the user to assure that only one input is received by the speakers by turning off the unwanted input device.

BRIEF DESCRIPTION OF THE DRAWINGS

FIG. 3 shows the circuitry from the inputs noted as Channel A and Channel B. This figure shows the signal from the output of the driver relays to the speaker relays and speakers.

FIG. 4 is an alternate embodiment of the peak detector circuit shown in FIG. 2.

FIG. 5 is a Truth Table showing the output of the J-K flip-flop.

FIG. 7 shows the switching logic when three inputs are involved.

DETAILED DESCRIPTION OF THE PREFERRED EMBODIMENT

This system as it has been designed consists of two peak detector sensing circuits. Each peak detector circuit is of standard design and is well known in the art. However, each peak detector circuit is modified for the particular consumer use described herein by the addition of the parallel combination of a resistor and capacitor as shown on FIG. 2. The preferred value of the resistor is 10K-ohm and of the capacitor is 1 microfarad. These values were chosen in order to minimize the flutter in the output of the comparator for signals which are found in the audio band. The values also allow for a quick reaction of the comparator when a signal ceases. The sensitivity of the opamp comparator circuit is determined by the voltage divider on the positive input to the comparator. Reducing the value of the 1K-ohm resistor on the positive input of the LM311 will increase the sensitivity of the circuit. The op-amp component used here is the 741 High Gain amplifier.

Figure 1:
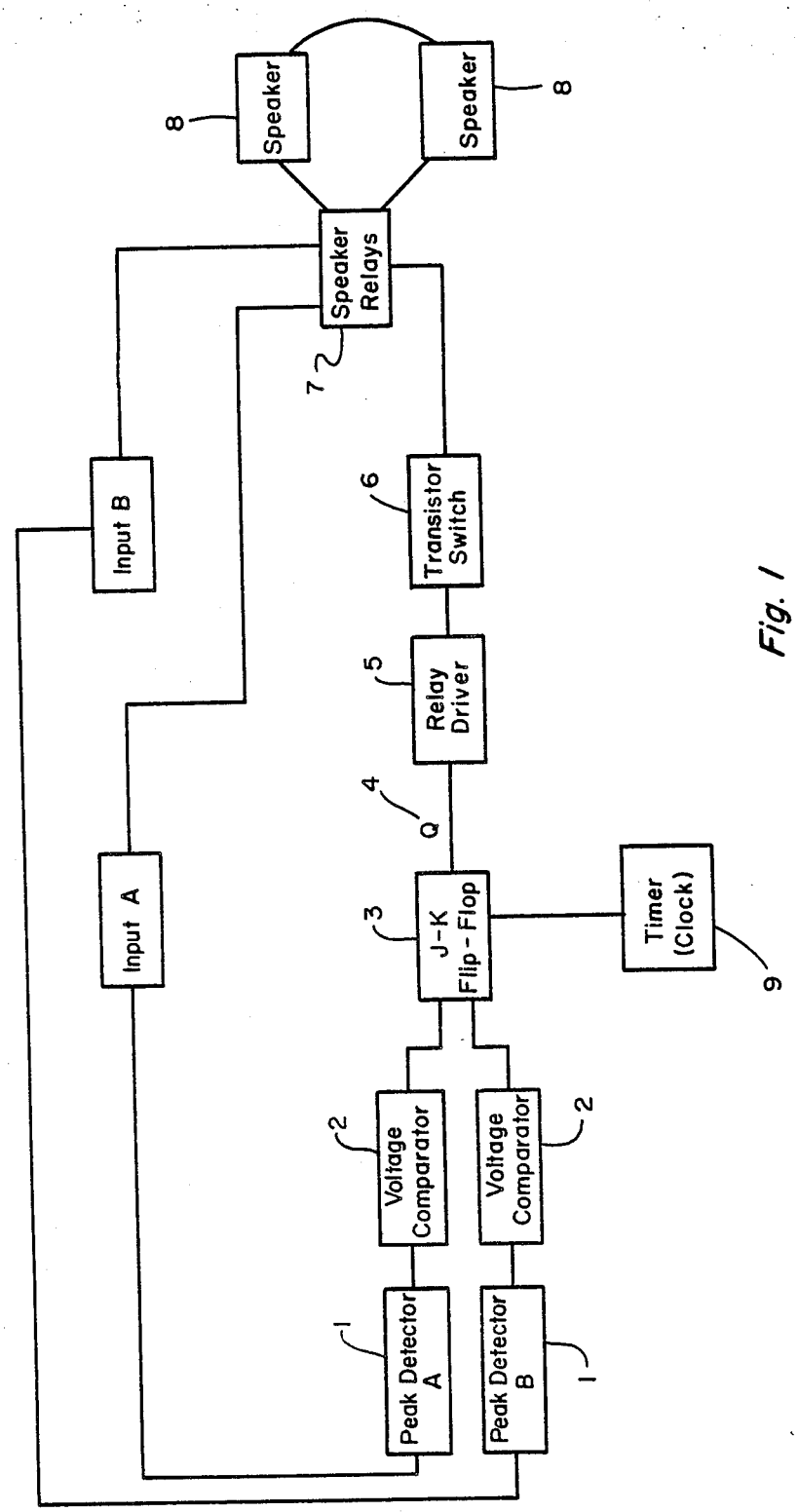
FIG. 1 is a block diagram showing the main components of the circuit.
Figure 2:
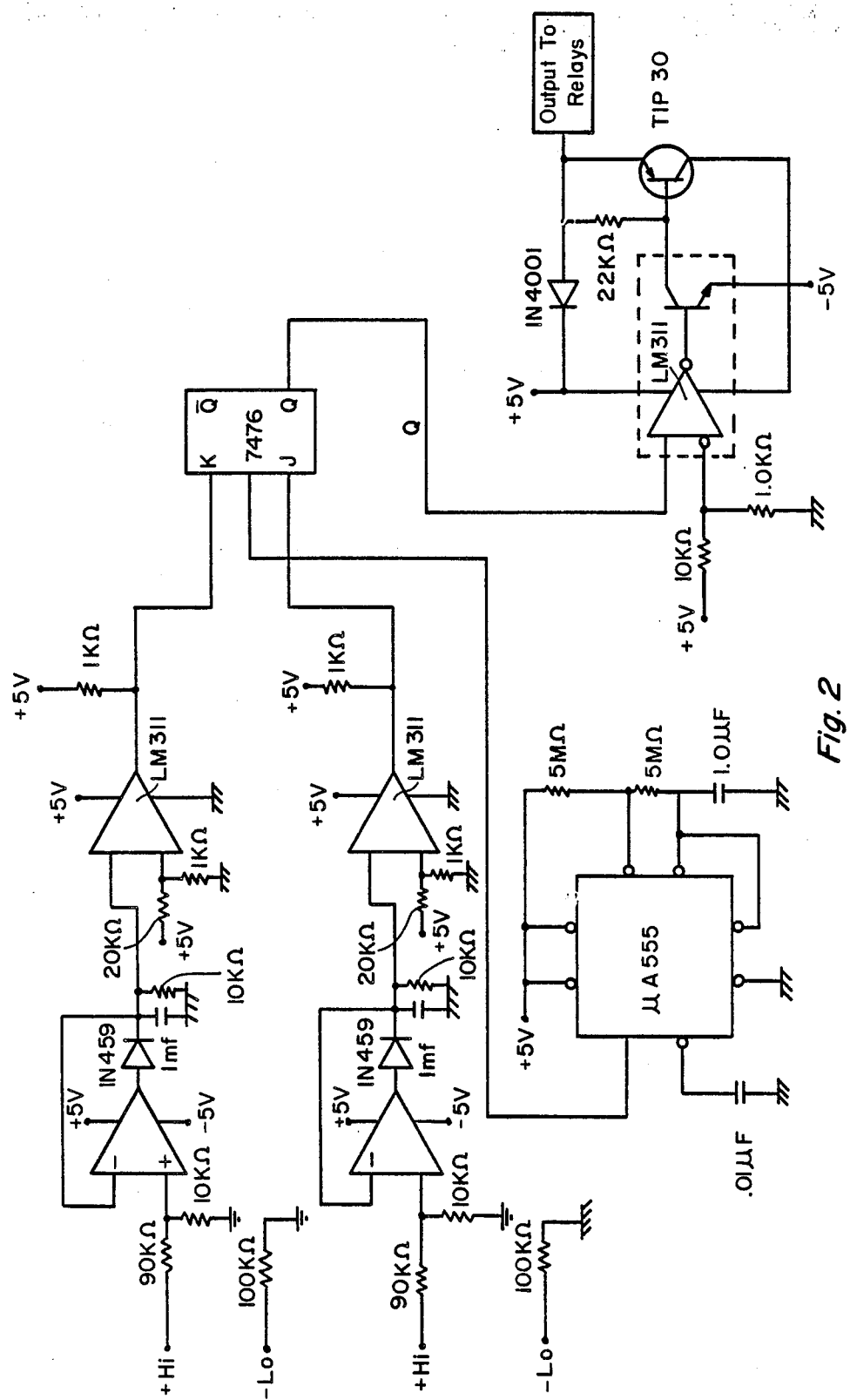
FIG. 2 is a schematic diagram showing the preferred embodiment of the circuitry from the input to the relay driver component and the switched output to the speaker relays.

The Voltage Comparator Circuit 2 is also of standard design. The LM311 voltage comparator is manufactured by National Semiconductor Corporation. Although the LM311 was chosen for this design, any voltage comparator or operational amplifier with similar electronic characteristics would be capable of use in this particular circuit. Each peak detector 1 is connected to a separate voltage comparator 2 which then feeds a signal into the J-K flip-flop 3. For convenience it is shown that input A is fed into peak detector A and hence into voltage comparator A and sends signal K into the J-K flip-flop. Input B is fed into peak detector B, hence to voltage comparator B which sends signal J into the J-K flip-flop as shown in FIGS. 1 and 2.

Also fed into the J-K flip-flop is a timer circuit 9. This timer circuit in the preferred embodiment is composed of a Fairchild 555 single timing circuit. This timing circuit is used to provide the clock pulses which drive the 7476 flip-flop. The flip-flop is triggered on the positive edge of the clock pulse. The timer is set up, as shown, in the astable mode. The two 5 meg-ohm resistors and the 1.0 micro-farad capacitor were chosen in order to obtain a clock period of slightly more than one second. Although the Fairchild 555 timer (clock) is shown here any timer of suitable design would be appropriate for this circuit.

The output of the two sensing circuits and the 555 timer drive the 7476 J-K flip-flop. This flip-flop has an output Q4 as shown on FIG. 1. The output Q 4 varies depending on the inputs of J and K. As shown in the Truth Table at FIG. 5, the output of Q will be either 1, 0, toggle, or no change, depending on the values obtained from the two sensing circuits shown in FIG. 2. The output, Q, is dependent on the values of J and K when the leading edge of the pulse is received. As shown in the Truth Table, if K is high and J is low the output is high. If K is low and J is high the output is low. These two modes correspond to the environmental situation wherein either the television or the stereo output are switched "on." In the case wherein both the television and the stereo are switched "on," both J and K would read high and the output to the speakers would toggle, producing an alternating one second output effect on the speakers which would then toggle between the output of the television and the stereo system. If both of the inputs are switched off, the output Q would remain unchanged.

In this particular design the output of the J-K flip-flop is insufficient to drive the speaker relays. In order to drive the speaker relays an additional comparator and solenoid driver circuit 5 is designed into the system. This is a standard circuit which has been modified in order to obtain the required 10 volts across the relay. The modification to this system provides a plus five volts and minus five volts to the comparator and solenoid driver. A 2.5 reference voltage is provided by the voltage divider at the inverting input to the comparator. This plus 2.5 voltage is a reference voltage which is midway between the expected values of Q. (The expected values of Q from the J-K flip-flop would be 0 to plus 5 volts.) Providing this 2.5 reference voltage prevents unwanted oscillations which could occur if the value of Q approached the value of the reference voltage.

The relay driver is connected to a transistor switch 6. The TIP 30 transistor switch is a common PNP transistor switch manufactured by National Semi-conductor and switches between the input signals A and B. In the actual operation of the circuit, if the input A (television) were "on" and the input B (stereo) were "off," then the switch would be in the mode to provide the signal A to the speaker relays and speakers. In the event that input A is "off" and input B is "on," then the transistor switch would provide signal B to the speaker relays and speaker. In the event that both the input A (television) and input B (stereo) are "on," then the dual signals will toggle between each other and the output to the speaker relays and the speaker will be a toggling signal. The speakers would reproduce the signal from the television and the stereo in alternating segments. The alternating segments would each last approximately one second. The speaker relays 7 consist of two double-pole double-throw relays which switch the signals as shown in the circuit diagram FIG. 3.

A variation of the operational amplifier peak detector circuits is shown in FIG. 4. In the circuit as shown in FIG. 4, the operational amplifier circuit behaves more like a difference amplifier than a peak detector circuit. However, both circuits perform the required function adequately. The modified operational amplifier circuit as shown in FIG. 4 could be used depending on the particular type of speaker lines which are to be utilized with this circuit design.

Figure 6:
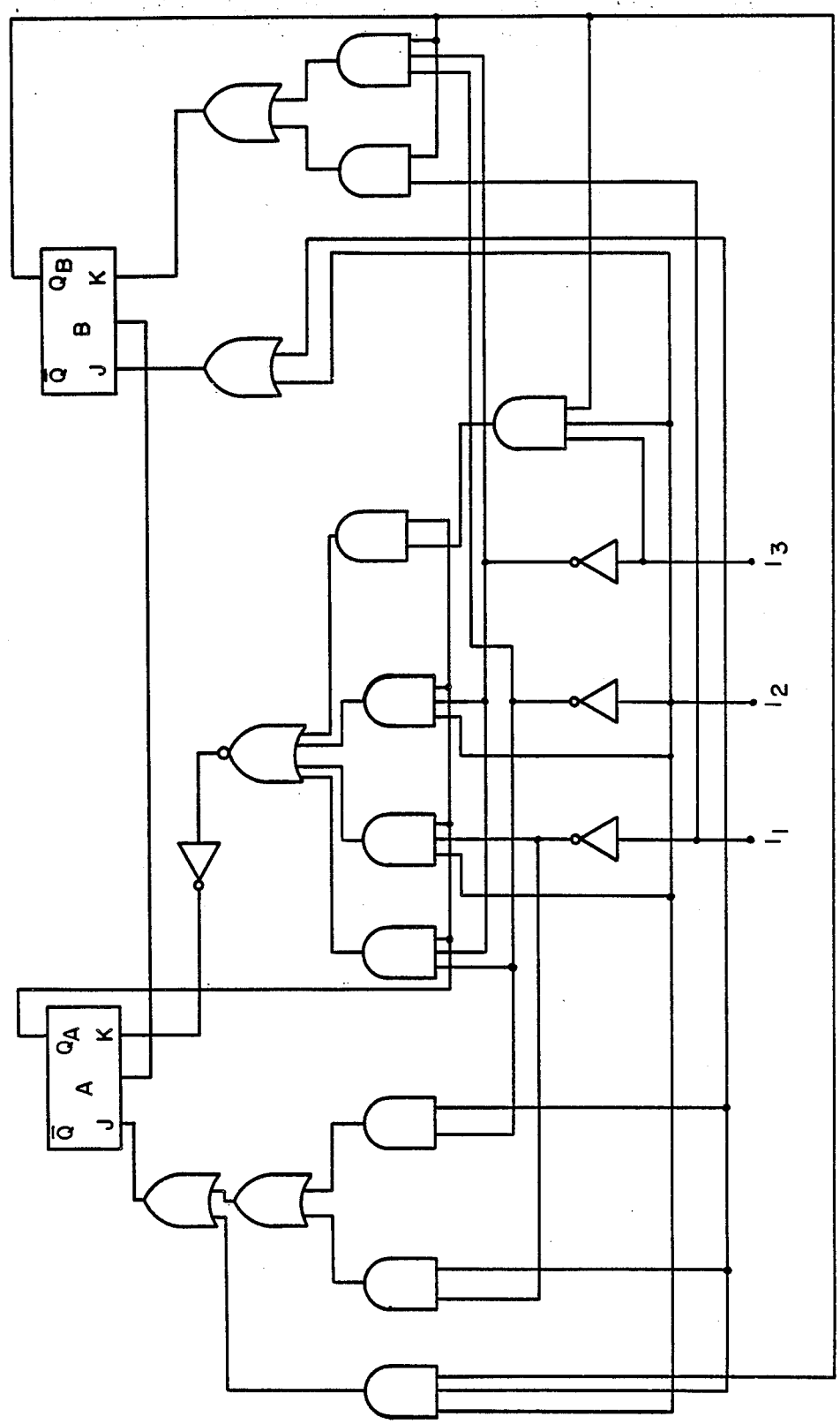
FIG. 6 is a schematic diagram of the circuitry when three inputs are involved.

Although the preferred embodiment of this invention involves two peak detector circuits, it is possible that three or more peak detector circuits and inputs can be accommodated using the general design of this circuit. As shown in FIG. 6, three inputs could be accommodated by the use of three peak detector circuits and voltage comparators, which are fed into two J-K flip-flops. The J-K flip-flops have timers similar to the circuit set out in FIG. 2 and the outputs of these peak detector circuits are fed to the speakers by way of the relays as shown in FIG. 7.

It is also possible to use this circuit design with N inputs. Each of the N inputs would require a peak detector-voltage comparator circuit. Each of the N inputs would be fed into (N - 1 J-K flip-flops. Each J-K flip-flop would be connected to a timer. The output of these J-K flip-flops would then be fed into relay drivers and switches which would ultimately switch on the speaker relays and speakers. The result of this circuitry involving N inputs would be to route whichever signal is "on" to the speakers. If two or more signals were "on," these signals would toggle at a approximately one second intervals through the speaker outputs.

In order to use this new circuit in the consumer environment, only two connections of the existing equipment are necessary. As shown in FIG. 1, an input A (which could be a television set) has its signal fed into the peak detector circuit A and into the speaker relays 7. A separate input B (which could be a stereo amplifier system) is fed into the peak detector circuit B and into the speaker relays 7. When the television input A is "on," peak detector circuit A will feed a signal through the J-K flip-flop 3 to the relay driver 5 through the transistor switch 6 and will ultimately drive the speaker relays 7 and speakers. In this case it is assumed that the input B is "off." Should the input B be turned "on" with the input A in the "off" position, the input B would be fed through the peak detector circuit B and ultimately to the speakers 8. In the event that both the input A and input B are turned on simultaneously, the timer 9 and the J-K flip-flop 3 will provide alternating speaker outputs. These speaker outputs would produce the signal of A and B alternating at approximately one second intervals.

From the above it is shown that the preferred embodiment of this invention is as described in FIGS. 1 and 2 and the above description. However, minor variations in components parts or design are contemplated without changing the gist of the invention herein.

Having fully described and disclosed the electronic circuit for toggling and switching between speakers I claim:

1. An electronic circuit for switching speakers, comprising:
   (a) a first peak detector circuit connected to a first voltage comparator which sends a first signal to a J-K flip-flop;
   (b) a second peak detector circuit connected to a second voltage comparator which sends a second signal to a J-K flip-flop;
   (c) a timer circuit connected to said J-K flip-flop;
   (d) a J-K flip-flop which toggles between said first and second signals and has an output Q;
   (e) a relay driver which receives said output Q and switches between said first and second signals according to the output Q and which drives speaker relays and speakers.

2. An electrical circuit as in claim 1, further comprising two inputs A and B which are connected to said speaker relays and to said first and second peak detectors, respectively.

3. An electrical circuit as in claim 1, wherein the peak detector circuit further comprises the parallel combination of a resistor and a capacitor in the comparator output to minimize flutter in consumer applications.

4. An electrical circuit as in claim 1, wherein said timer toggles between said first and second signals at approximately one second intervals, whereby when both signals are high, the output of said circuit toggles between the signal from said first and second signals.

5. An electrical circuit for switching speakers, comprising:
   (a) first, second and third peak detectors connected to first, second and third voltage comparators respectively which send first, second and third signals to a pair of J-K flip-flops;
   (b) a timer circuit connected to each of said J-K flip-flops;
   (c) a pair of J-K flip-flops which each toggle between the three input signals;
   (d) a pair of relay drivers which receive the signal from the J-K flip-flops and switch between said three signals to drive speaker relays and speakers.

6. An electrical circuit as in claim 5, wherein said timers toggle between said three signals at approximately one second intervals, whereby when all three input signals are high the circuit output will toggle between said three signals.

7. An electrical circuit as in claim 5, whereby when any two of said three signals are high the circuit output will toggle between said two signals.

8. An electrical circuit for switching speakers, comprising:
   (a) N peak detectors connected to N voltage comparators, respectively, which send N signals to (N-1) J-K flip-flops;
   (b) A timer circuit connected to each of (N-1) flip-flops;
   (c) (N-1) J-K flip-flops which toggle between said N signals;
   (d) (N-1) relays which receive said signal from said flip-flop and which switch between said N signals to drive speaker relays and speakers.

* * * * *